(12) United States Patent
Matsumoto et al.

(10) Patent No.: US 10,777,460 B2
(45) Date of Patent: Sep. 15, 2020

(54) PROCESSING METHOD OF WORKPIECE

(71) Applicant: DISCO CORPORATION, Tokyo (JP)

(72) Inventors: Yukiko Matsumoto, Tokyo (JP); Meiyu Piao, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 16/393,402

(22) Filed: Apr. 24, 2019

(65) Prior Publication Data

US 2019/0333817 A1    Oct. 31, 2019

(30) Foreign Application Priority Data

Apr. 27, 2018  (JP) .................................. 2018-087206

(51) Int. Cl.
| | | |
|---|---|---|
| H01L 21/78 | (2006.01) | |
| H01L 23/544 | (2006.01) | |
| H01L 21/268 | (2006.01) | |
| H01L 21/308 | (2006.01) | |
| B23K 26/00 | (2014.01) | |
| B23K 26/364 | (2014.01) | |
| H01L 21/3065 | (2006.01) | |

(52) U.S. Cl.
CPC .......... *H01L 21/78* (2013.01); *B23K 26/0006* (2013.01); *B23K 26/364* (2015.10); *H01L 21/268* (2013.01); *H01L 21/308* (2013.01); *H01L 21/3065* (2013.01); *H01L 23/544* (2013.01); *H01L 2223/5446* (2013.01)

(58) Field of Classification Search
CPC ......... H01L 21/3065; H01L 2223/5446; H01L 2221/68327; H01L 21/3086; H01L 21/3081; H01L 21/6836; B23K 26/364
See application file for complete search history.

(56) References Cited

U.S. PATENT DOCUMENTS

| | | | | |
|---|---|---|---|---|
| 2010/0311227 A1* | 12/2010 | Hatakeyama | ..... | H01L 21/67132 438/464 |
| 2017/0005225 A1* | 1/2017 | Okamoto | ............ | H01L 33/0095 |
| 2017/0352593 A1* | 12/2017 | Grivna | ................ | H01L 21/6836 |

FOREIGN PATENT DOCUMENTS

JP        2001127011 A    5/2001

* cited by examiner

*Primary Examiner* — Mohammed R Alam
(74) *Attorney, Agent, or Firm* — Greer Burns & Crain, Ltd.

(57) ABSTRACT

A processing method of a workpiece for processing the workpiece including a substrate and a film made on a back surface of the substrate is provided. The processing method includes a sheet sticking step of sticking a sheet to the film, a protective film forming step of forming a protective film that covers the front surface side of the substrate, a mask pattern forming step of removing a part corresponding to planned dividing lines in the protective film and forming a mask pattern on the front surface side, an etching step of carrying out dry etching for the substrate from the front surface side and forming etching grooves and a film dividing step of dividing the film along the etching grooves by pressing the workpiece by an edge of a tip part of a pressing member having the tip part in which the edge has a curved shape.

7 Claims, 6 Drawing Sheets

PROCESSING METHOD OF WORKPIECE

BACKGROUND OF THE INVENTION

Field of the Invention

The present invention relates to a processing method of a workpiece for processing the workpiece including a substrate such as a wafer and a film made on a back surface of the substrate.

Description of the Related Art

When device chips incorporated into various pieces of electronic equipment and so forth are manufactured, first, devices such as integrated circuit (IC) are formed in the respective regions of a wafer marked out by plural planned dividing lines (streets). By dividing this wafer along the planned dividing lines by using a cutting apparatus, a laser processing apparatus or the like, for example, plural device chips corresponding to the respective devices are obtained.

Incidentally, in the above-described processing method using a cutting apparatus, the wafer is divided while being crushed by a rotated cutting blade. Thus, a breakage such as a defect (chipping) readily occurs in the device chip and the flexural strength thereof also tends to lower. Furthermore, the cutting blade needs to be made to cut into each of the plural planned dividing lines. Therefore, when the number of planned dividing lines becomes larger, the time necessary for the completion of the processing also becomes longer.

In contrast, in the processing method using a laser processing apparatus, the wafer is divided without mechanically chipping away the wafer. Therefore, while the occurrence of a defect or the like is suppressed and significant lowering of the flexural strength is prevented, the width necessary for the dividing (cutting allowance) can also be set small (narrow). However, also in this processing method, each of the plural planned dividing lines needs to be irradiated with a laser beam. Thus, when the number of planned dividing lines becomes larger, the time of the processing also becomes longer after all.

In recent years, a processing method in which a wafer is divided by using dry etching (plasma etching) has also been proposed (for example, refer to Japanese Patent Laid-Open No. 2001-127011). In this processing method, the whole of the wafer is processed at a time by the dry etching. Therefore, even when the diameter of the wafer becomes larger or the size of the device (device chip) becomes smaller, the time of the processing does not become longer. Furthermore, the wafer is not mechanically chipped away and therefore it is also possible to suppress the occurrence of a defect or the like and prevent significant lowering of the flexural strength.

SUMMARY OF THE INVENTION

Incidentally, on the back surface of the above-described wafer, a film of a metal or the like that can be hardly processed by the dry etching for processing the wafer is often formed. In this case, in the existing processing method using the dry etching, the workpiece including the above-described film of a metal or the like cannot be properly divided.

Thus, an object of the present invention is to provide a new processing method of a workpiece that can surely divide the workpiece.

In accordance with an aspect of the present invention, there is provided a processing method of a workpiece for processing the workpiece including a substrate having a plurality of regions marked out by a plurality of planned dividing lines intersecting each other on a front surface side and a film made on a back surface of the substrate. The processing method includes a sheet sticking step of sticking a sheet to the film made on the back surface of the substrate and sticking a peripheral part of the sheet to a ring-shaped frame, a protective film forming step of forming a protective film that covers the front surface side of the substrate, and a mask pattern forming step of removing a part corresponding to the planned dividing lines in the protective film and forming a mask pattern formed of the protective film on the front surface side of the substrate after carrying out the protective film forming step. The processing method further includes an etching step of carrying out dry etching for the substrate from the front surface side on which the mask pattern is formed and forming etching grooves along the planned dividing lines after carrying out the mask pattern forming step and a film dividing step of dividing the film along the etching grooves by pressing the workpiece with the intermediary of the sheet by an edge of a tip part of a pressing member having the tip part in which the edge has a curved shape after carrying out the etching step.

In the above-described aspect of the present invention, it is preferable that the processing method of a workpiece further include an adhesion step of heating the sheet or the workpiece to cause the sheet to adhere to the workpiece after carrying out the sheet sticking step.

Furthermore, in the aspect of the present invention, the pressing member may be moved in a direction along any of the plurality of planned dividing lines intersecting each other in the film dividing step. Moreover, the pressing member may be moved in a direction intersecting each of the plurality of planned dividing lines intersecting each other in the film dividing step.

In addition, in the aspect of the present invention, it is preferable that the etching grooves with such a depth as not to reach the film be formed to cause part of the substrate to remain on the side of the back surface relative to the etching grooves in the etching step.

In the processing method of a workpiece according to the aspect of the present invention, the dry etching is carried out from the front surface side of the substrate on which the film is made on the back surface and the etching grooves along the planned dividing lines are formed. Thereafter, the workpiece is pressed by the edge of the tip part of the pressing member having the tip part in which the edge has a curved shape and the remaining film and so forth are divided along the etching grooves. Therefore, the workpiece including the film can be surely divided differently from the existing processing method using only dry etching.

Furthermore, in the processing method of a workpiece according to the aspect of the present invention, it suffices to only press the workpiece by the edge of the tip part of the pressing member when the film and so forth remaining in the workpiece are divided along the etching grooves. Therefore, the workpiece can be easily divided compared with the case of using a cutting apparatus or a laser processing apparatus for the dividing of this film and so forth, or the like. As above, according to the aspect of the present invention, a new processing method of a workpiece by which the workpiece can be divided easily and surely is provided.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

An embodiment according to one aspect of the present invention will be described with reference to the accompanying drawings. A processing method of a workpiece according to the present embodiment includes a sheet sticking step (see FIG. 1), a sheet adhesion step (see FIG. 2A), a protective film forming step (see FIG. 2B), a mask pattern forming step (see FIG. 3A), an etching step (see FIG. 3B), a film dividing step (see FIG. 4A, FIG. 4B, FIG. 5A, and FIG. 5B), and a mask pattern removing step (see FIG. 6).

In the sheet sticking step, a sheet is stuck (attached) to the film side of a workpiece (i.e. back surface side of a substrate) including the substrate having plural regions marked out by plural planned dividing lines intersecting each other on the front surface side and the film made on the back surface of the substrate. In the sheet adhesion step, the sheet is heated to cause the sheet to adhere to the workpiece.

In the protective film forming step, a protective film that covers the front surface side of the substrate is formed. In the mask pattern forming step, the part corresponding to the planned dividing lines in the protective film is removed and a mask pattern formed of the protective film is formed on the front surface side of the substrate. In the etching step, dry etching (plasma etching) is carried out for the substrate from the front surface side on which the mask pattern is formed and etching grooves along the planned dividing lines are formed.

In the film dividing step, the film is divided along the etching grooves by pressing the workpiece with the intermediary of the sheet by the edge of a tip part of a pressing member having the tip part in which the edge has a curved shape. In the mask pattern removing step, the mask pattern that remains on the front surface side of the substrate is removed. The processing method of a workpiece according to the present embodiment will be described in detail below.

Figure 1A:
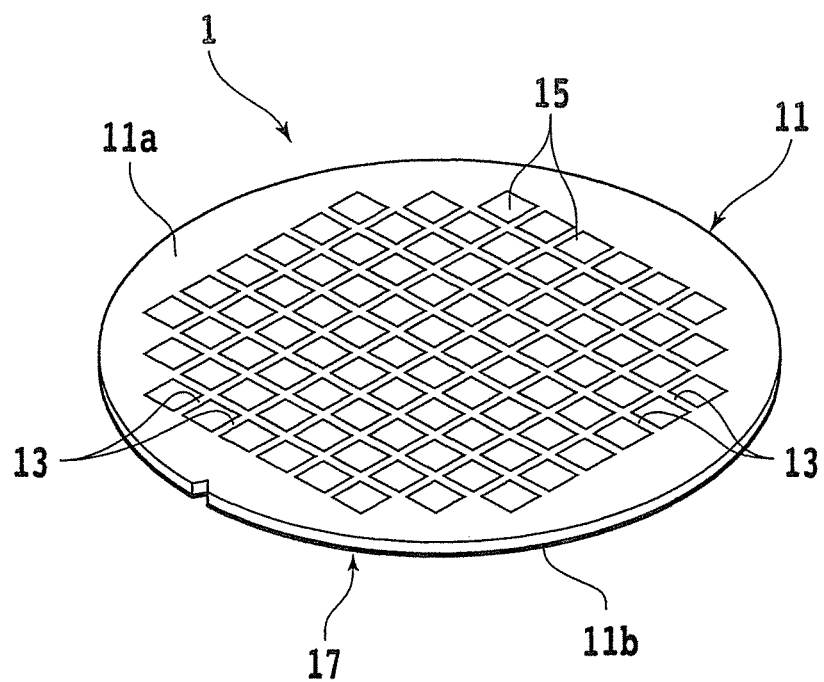
FIG. 1A is a perspective view schematically depicting a configuration example of a workpiece.

FIG. 1A is a perspective view schematically depicting a configuration example of a workpiece 1 processed by the processing method of a workpiece according to the present embodiment. As depicted in FIG. 1A, the workpiece 1 of the present embodiment includes a wafer formed into a circular disc shape by using a semiconductor material such as silicon (Si) as a substrate 11. The side of a front surface 11a of the substrate 11 is divided into a device region at the center and a peripheral surplus region surrounding the device region.

The device region is further segmented into plural regions by planned dividing lines (streets) 13 arranged in a lattice manner and a device 15 such as IC is formed in each region. Furthermore, a film 17 composed of a material such as a metal is made on the side of a back surface 11b of the substrate 11. The film 17 is a multilayer or single-layer metal film composed of titanium (Ti), nickel (Ni), gold (Au) or the like, for example, and functions as an electrode or the like. The film 17 is formed also in the region overlapping with the planned dividing lines 13 in plan view as viewed from the side of the front surface 11a or the side of the back surface 11b.

Although the workpiece 1 including a circular-disc-shaped wafer composed of a semiconductor material such as silicon as the substrate 11 is used in the present embodiment, there is no limit to the material, shape, structure, size, and so forth of the substrate 11. For example, it is also possible to use the workpiece 1 including a package wafer or the like sealed by a resin as the substrate 11. Similarly, there is no limit also to the kind, quantity, shape, structure, size, arrangement, and so forth of the device 15 and the film 17. The devices 15 do not have to be formed on the substrate 11.

Figure 1B:
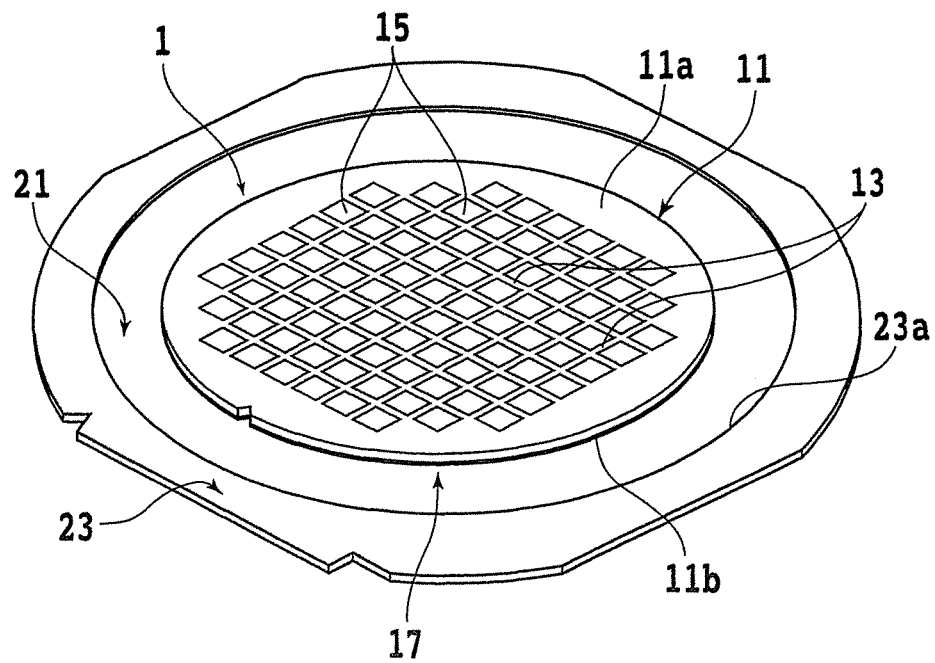
FIG. 1B is a perspective view depicting a sheet sticking step.

In the present embodiment, first, the sheet sticking step of sticking a sheet to the film 17 of the workpiece 1 (on the side of the back surface 11b of the substrate 11) is carried out. FIG. 1B is a perspective view depicting the sheet sticking step. As depicted in FIG. 1B, the sheet 21 used in the sheet sticking step is typically a film-shaped member composed of a material such as a resin. A rubber-based or acrylic-based bonding layer (not depicted) showing bonding strength with respect to the workpiece 1 is made on the front surface side of the sheet 21. However, there is no particular limit to the material of the bonding layer.

In the sheet sticking step, for example, the workpiece 1 is placed on a table or the like (not depicted) together with a ring-shaped frame 23 in such a manner that the film 17 of the workpiece 1 (on the side of the back surface 11b of the substrate 11) is exposed upward. The frame 23 has an opening 23a with a diameter larger than the workpiece 1 and is disposed around the workpiece 1 in such a manner that the workpiece 1 is housed in the region inside the opening 23a. Thereafter, the bonding layer of the sheet 21 (on the front surface side) is brought into contact with the film 17 of the workpiece 1 and the frame 23.

Moreover, a pressure is applied by a roller (not depicted) or the like from the back surface side of the sheet 21 and the sheet 21 is pressure-bonded to the workpiece 1 (film 17) and the frame 23. Then, the sheet 21 is cut into a circular shape along the frame 23 by a cutter or the like. This makes the state in which the central part of the circular sheet 21 is stuck to the film 17 of the workpiece 1 and the peripheral part of the circular sheet 21 is stuck to the ring-shaped frame 23.

When the workpiece 1 is supported by the ring-shaped frame 23 with the intermediary of the circular sheet 21, the sheet sticking step ends. In the present embodiment, after the sheet 21 is pressure-bonded to the workpiece 1 (film 17) and the frame 23, the sheet 21 is cut into the circular shape. However, it is also possible that the sheet 21 cut into the circular shape in advance be pressure-bonded to the workpiece 1 (film 17) and the frame 23.

Figure 2A:
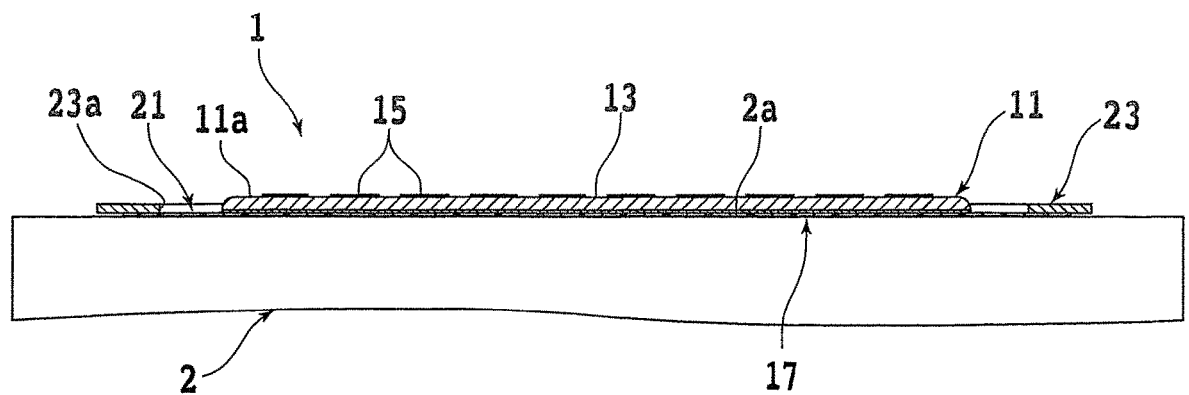
FIG. 2A is a partial sectional side view depicting a sheet adhesion step.

After the sheet sticking step, the sheet adhesion step of causing the sheet 21 to adhere to the workpiece 1 (film 17) is carried out. FIG. 2A is a partial sectional side view depicting the sheet adhesion step. The sheet adhesion step in the present embodiment is carried out by using a hot plate 2 depicted in FIG. 2A, for example.

Specifically, first, the hot plate 2 is heated and a heating surface 2a thereof is kept at a predetermined temperature. Although there is no particular limit to the temperature of the heating surface 2a, the temperature is set to at least 60° C. and at most 100° C. and preferably to approximately 80° C., for example. Thereafter, in the state in which the temperature of the heating surface 2a is kept, the workpiece 1 and so forth are placed on the hot plate 2 in such a manner that the sheet 21 stuck to the workpiece 1 is brought into contact with the heating surface 2a.

Due to this, the sheet 21 is heated by heat from the hot plate 2. As a result, the bonding layer of the sheet 21 is softened and the adhesiveness between the sheet 21 and the film 17 of the workpiece 1 (side of the back surface 11b of the substrate 11) is enhanced. Although there is no particular limit to the time of this heating, the time is set to 15 seconds or longer and preferably to approximately 30 seconds, for example. When a predetermined time necessary for the improvement in the adhesiveness has elapsed, the sheet adhesion step ends.

Figure 2B:
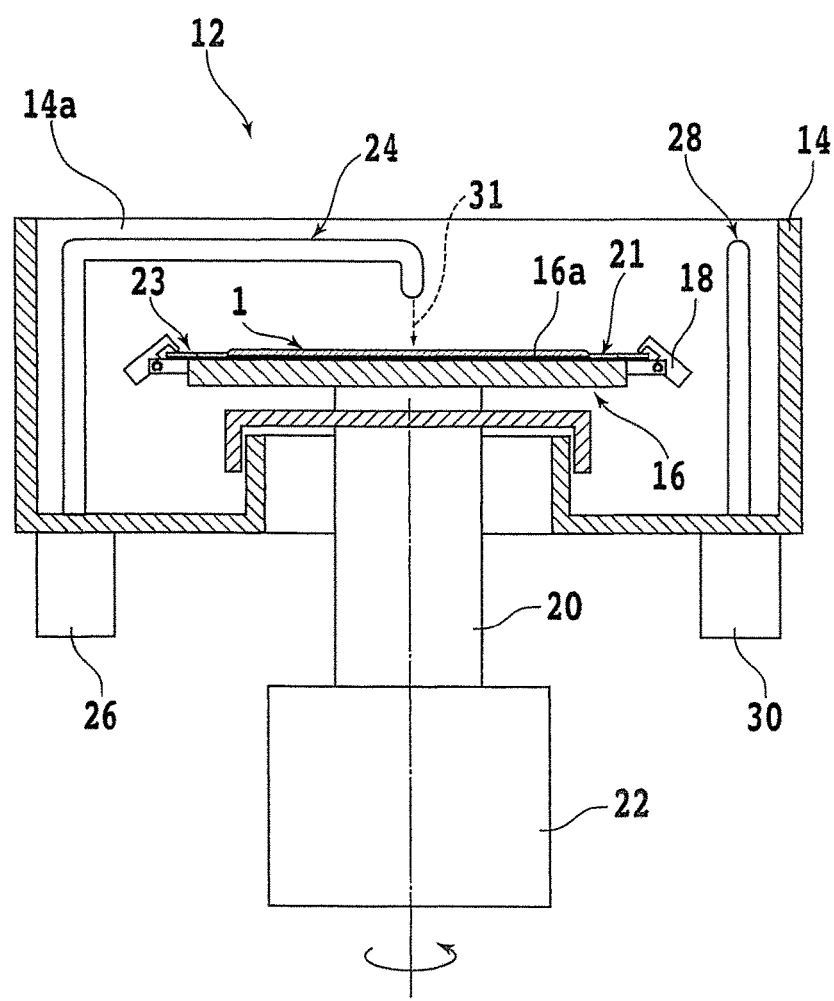
FIG. 2B is a partial sectional side view depicting a protective film forming step.

After the sheet adhesion step, the protective film forming step of forming a protective film that covers the side of the front surface 11a of the substrate 11 is carried out. FIG. 2B is a partial sectional side view depicting the protective film forming step. The protective film forming step in the present embodiment is carried out by using a spin coater 12 depicted in FIG. 2B, for example.

The spin coater 12 includes a circular cylindrical housing part 14 in which the workpiece 1 and so forth are housed. A region 14a inside the housing part 14 serves as a treatment chamber when the protective film is formed for the workpiece 1. A spinner table 16 is disposed near the center of the region 14a. Part of the upper surface of the spinner table 16 is a holding surface 16a for sucking and holding the workpiece 1 (sheet 21 stuck to the workpiece 1). A suction source (not depicted) is connected to the holding surface 16a through a flow path (not depicted) formed inside the spinner table 16, and so forth.

Plural clamps 18 for fixing the above-described ring-shaped frame 23 are disposed around the spinner table 16. Furthermore, a rotational drive source 22 such as a motor is coupled to the lower part of the spinner table 16 with the intermediary of a rotating shaft 20. The spinner table 16 rotates by a force transmitted from the rotational drive source 22.

A first nozzle 24 that drops a liquid resin 31 that is the raw material of the protective film from the tip part is disposed above the spinner table 16. A rotational drive source 26 such as a motor is coupled to the base end part of the first nozzle 24 and the tip part of the first nozzle 24 that drops the liquid resin 31 moves in a region above the spinner table 16 by a force transmitted from the rotational drive source 26.

In the present embodiment, the first nozzle 24 is rotated by the force of the rotational drive source 26. Thus, the movement path of the tip part of the first nozzle 24 has a circular arc shape. When the liquid resin 31 is dropped, the tip part of the first nozzle 24 is moved from an evacuation region located at an end part of the region 14a to a drop region directly above the spinner table 16.

Furthermore, a second nozzle 28 that sprays a fluid for cleaning from the tip part is disposed above the spinner table 16. A rotational drive source 30 such as a motor is coupled to the base end part of the second nozzle 28 and the tip part of the second nozzle 28 that sprays the fluid for cleaning moves in a region above the spinner table 16 by a force transmitted from the rotational drive source 30.

In the present embodiment, the second nozzle 28 is rotated by the force of the rotational drive source 30. Thus, the movement path of the tip part of the second nozzle 28 has a circular arc shape. When the fluid for cleaning is sprayed, the tip part of the second nozzle 28 is moved from an evacuation region located at an end part of the region 14a to a cleaning region directly above the spinner table 16.

In the protective film forming step, first, the workpiece 1 and so forth are placed on the spinner table 16 in such a manner that the sheet 21 stuck to the workpiece 1 is brought into contact with the holding surface 16a of the spinner table 16. Next, a negative pressure of the suction source is caused to act on the holding surface 16a. Thereby, the side of the film 17 of the workpiece 1 (side of the back surface 11b of the substrate 11) is sucked and held by the spinner table 16 with the intermediary of the sheet 21. That is, the state in which the side of the front surface 11a of the substrate 11 is exposed upward is obtained.

Thereafter, the tip part of the first nozzle 24 is moved to the drop region directly above the spinner table 16 and the liquid resin 31 is dropped from this tip part toward the workpiece 1 (front surface 11a of the substrate 11) held by the spinner table 16. In conjunction with this, the spinner table 16 is rotated.

Due to this rotation of the spinner table 16, the liquid resin 31 spreads over the whole of the front surface 11a of the substrate 11 and a protective film 33 (see FIG. 3A and so forth) is formed. As the liquid resin 31, a material is selected that can form the protective film 33 having a certain level of resistance against dry etching (plasma etching) carried out in the later etching step. For example, water-soluble polyvinyl alcohol (PVA), polyvinylpyrrolidone (PVP) or the like can be used as the liquid resin 31.

When the protective film 33 covering the side of the front surface 11a of the substrate 11 has been formed, the protective film forming step ends. Each clamp 18 is configured to be capable of fixing the frame 23 by using a centrifugal force, for example. When the spinner table 16 is rotated, the frame 23 is fixed by the clamps 18. For this reason, even when the spinner table 16 is rotated at high speed, the workpiece 1 and the frame 23 do not drop off from the spinner table 16.

Figure 3A:
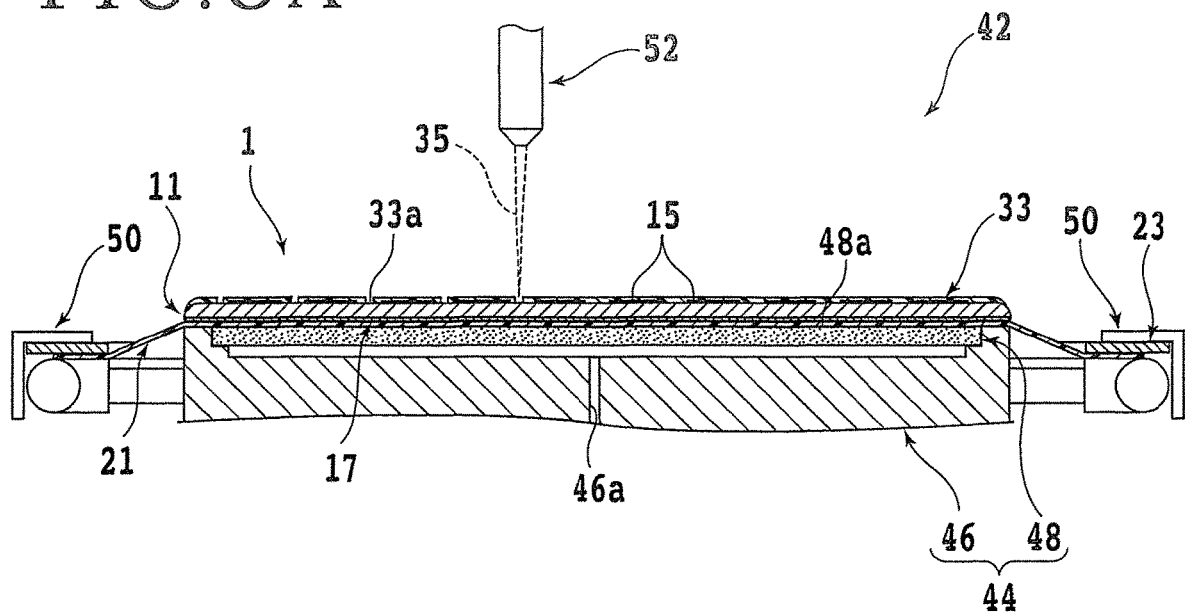
FIG. 3A is a partial sectional side view depicting a mask pattern forming step.

After the protective film forming step, the mask pattern forming step is carried out in which the part corresponding to the planned dividing lines 13 in the protective film 33 is removed and a mask pattern formed of the protective film 33 is formed on the side of the front surface 11a of the substrate 11. FIG. 3A is a partial sectional side view depicting the mask pattern forming step. The mask pattern forming step is carried out by using a laser processing apparatus 42 depicted in FIG. 3A, for example.

The laser processing apparatus 42 includes a chuck table 44 for holding the workpiece 1 with the intermediary of the sheet 21. For example, the chuck table 44 includes a circular cylindrical frame body 46 composed of a metal material typified by stainless steel and a holding plate 48 that is composed of a porous material and is disposed over the frame body 46.

The upper surface of the holding plate 48 serves as a holding surface 48a for sucking and holding the sheet 21 stuck to the workpiece 1. The lower surface side of the holding plate 48 is connected to a suction source (not depicted) through a flow path 46a made inside the frame body 46, a valve (not depicted), and so forth. Therefore, a negative pressure of the suction source can be caused to act on the holding surface 48a when the valve is opened.

Plural clamps 50 for fixing the frame 23 are disposed around the frame body 46. The frame body 46 (chuck table 44) is coupled to a rotational drive source (not depicted) such as a motor and rotates around a rotation axis substantially perpendicular to the above-described holding surface 48a. Furthermore, the frame body 46 (chuck table 44) is supported by a movement mechanism (not depicted) and moves in a direction substantially parallel to the above-described holding surface 48a.

A laser irradiation unit 52 is disposed above the chuck table 44. The laser irradiation unit 52 emits and focuses a laser beam 35 pulse-oscillated by a laser oscillator (not depicted) onto a predetermined position. The laser oscillator used in the present embodiment is configured to be capable of pulse-oscillation of the laser beam 35 with a wavelength showing a certain level of absorbability (such a wavelength as to be readily absorbed) with respect to the protective film 33 made on the side of the front surface 11a of the substrate 11, and is suitable for ablation processing of the protective film 33.

In the mask pattern forming step, first, the sheet 21 stuck to the workpiece 1 is brought into contact with the holding surface 48a of the chuck table 44 and the negative pressure of the suction source is caused to act on the holding surface 48a. In addition, the frame 23 is fixed by the clamps 50. Thereby, the workpiece 1 is held by the chuck table 44 in the state in which the protective film 33 made on the side of the front surface 11a of the substrate 11 is exposed upward.

Next, the chuck table 44 is moved, rotated, and so forth and the position of the laser irradiation unit 52 is aligned with the upper side of an extended line of the arbitrary planned dividing line 13, for example. Then, as depicted in FIG. 3A, while the laser beam 35 is emitted from the laser irradiation unit 52 toward the protective film 33 (side of the front surface 11a of the substrate 11), the chuck table 44 is moved in the direction parallel to the planned dividing line 13 of the target.

The laser beam 35 is focused on the front surface of the protective film 33, for example. By irradiating the protective film 33 with the laser beam 35 with a wavelength showing a certain level of absorbability with respect to the protective film 33 along the planned dividing line 13 as above, the protective film 33 can be removed along the planned dividing line 13 and an exposed part 33a at which the front surface 11a of the substrate 11 is exposed can be formed. Conditions of the laser beam 35, such as the output power, the spot diameter, and the repetition frequency, are arbitrarily set within a range in which the part corresponding to the planned dividing line 13 in the protective film 33 can be properly removed.

After the protective film 33 is removed along the planned dividing line 13 of the target and the exposed part 33a is formed, the chuck table 44 is moved, rotated, and so forth again and the position of the laser irradiation unit 52 is aligned with the upper side of an extended line of the different planned dividing line 13. Then, while the laser beam 35 is emitted from the laser irradiation unit 52 toward the protective film 33, the chuck table 44 is moved in the direction parallel to the different planned dividing line 13.

Such a procedure is repeated. When the protective film 33 has been removed along all planned dividing lines 13 and the mask pattern having the exposed part 33a corresponding to each planned dividing line 13 has been completed, the mask pattern forming step ends. In the mask pattern forming step in the present embodiment, only the protective film 33 is removed along each planned dividing line 13. However, the side of the front surface 11a of the substrate 11 may be slightly removed when the protective film 33 is removed.

Figure 3B:
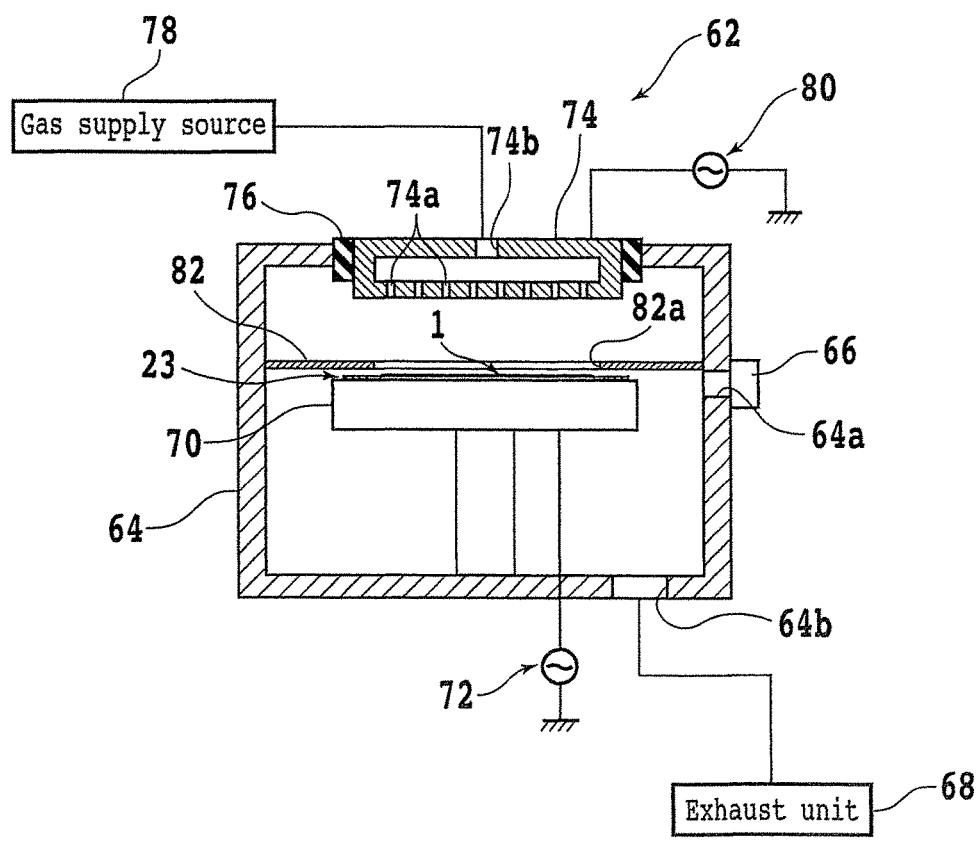
FIG. 3B is a partial sectional side view depicting an etching step.

After the mask pattern forming step, the etching step is carried out in which dry etching (plasma etching) is carried out for the substrate 11 from the side of the front surface 11a on which the mask pattern (protective film 33) is formed and etching grooves are formed along the planned dividing lines 13. FIG. 3B is a partial sectional side view depicting the etching step. The etching step is carried out by using an etching apparatus 62 depicted in FIG. 3B, for example.

The etching apparatus 62 includes a vacuum chamber 64 inside which a space for treatment is formed. In a sidewall of the vacuum chamber 64, an opening 64a for carrying in and out the workpiece 1 and so forth is formed. A gate 66 with such a size as to cover the opening 64a is disposed outside the opening 64a.

An opening-closing mechanism (not depicted) is coupled to the gate 66 and the gate 66 is opened and closed by this opening-closing mechanism. By opening the gate 66 to expose the opening 64a, the workpiece 1 and so forth can be carried in to the space inside the vacuum chamber 64 or the workpiece 1 and so forth can be carried out from the space inside the vacuum chamber 64 through the opening 64a.

An exhaust port 64b is formed in the bottom wall of the vacuum chamber 64. The exhaust port 64b is connected to an exhaust unit 68 such as a vacuum pump. A lower electrode 70 is disposed in the space of the vacuum chamber 64. The lower electrode 70 is formed into a circular disc shape by using an electrically-conductive material and is connected to a high-frequency power supply 72 outside the vacuum chamber 64.

On the upper surface side of the lower electrode 70, an electrostatic chuck (not depicted) is disposed, for example. The electrostatic chuck includes plural electrodes insulated from each other and sucks and holds the workpiece 1 by using an electrical force generated between each electrode and the workpiece 1. However, the etching apparatus 62 in the present embodiment does not necessarily have to include the electrostatic chuck.

An upper electrode 74 formed into a circular disc shape by using an electrically-conductive material is attached to the ceiling wall of the vacuum chamber 64 with the intermediary of an insulating material 76. Plural gas ejection holes 74a are formed on the lower surface side of the upper electrode 74 and these gas ejection holes 74a are connected to a gas supply source 78 through a gas supply hole 74b made on the upper surface side of the upper electrode 74, and so forth. This can supply a gas for etching into the space of the vacuum chamber 64. The upper electrode 74 is also connected to a high-frequency power supply 80 outside the vacuum chamber 64.

In the etching step, first, the gate 66 is lowered by the opening-closing mechanism. Next, the workpiece 1 is carried in to the space of the vacuum chamber 64 through the opening 64a and is placed on the electrostatic chuck (lower electrode 70). Specifically, the sheet 21 stuck to the workpiece 1 is brought into contact with the upper surface of the electrostatic chuck. Thereafter, when the electrostatic chuck is actuated, the workpiece 1 is sucked and held by the electrostatic chuck in the state in which the mask pattern (protective film 33) made on the side of the front surface 11a of the substrate 11 is exposed upward.

After the workpiece 1 is sucked and held by the electrostatic chuck, dry etching (plasma etching) is carried out on the side of the front surface 11a of the substrate 11 with the intermediary of the mask pattern (protective film 33) and thereby etching grooves 19 (see FIG. 4A) are formed along the planned dividing lines 13. Specifically, first, the gate 66 is raised by the opening-closing mechanism to seal the space of the vacuum chamber 64.

Furthermore, the exhaust unit 68 is actuated to reduce the pressure in the space. In this state, while the gas for etching is supplied from the gas supply source 78 at a predetermined flow rate, appropriate high-frequency power is supplied to the lower electrode 70 and the upper electrode 74 by the high-frequency power supplies 72 and 80. Along with this, plasma including radicals, ions, and so forth is generated between the lower electrode 70 and the upper electrode 74.

Due to this, the side of the front surface 11a of the substrate 11 that is not covered by the mask pattern (protective film 33) (i.e. regions corresponding to the planned dividing lines 13) can be exposed to the plasma and the workpiece 1 can be processed. The gas for etching supplied from the gas supply source 78 is properly selected according to the material of the substrate 11 and so forth.

There is no limit to the specific technique employed for the etching. For example, it is also possible to form the etching grooves 19 in the substrate 11 by using an etching technique referred to as the so-called Bosch process or the like. This etching is continued until the etching grooves 19 (see FIG. 4A) with a sufficient depth are formed in the substrate 11.

There is no particular limit to the specific depth of the etching grooves 19. However, for example, it is desirable that the etching grooves 19 with such a depth as not to reach the film 17 be formed and part of the substrate 11 be caused to remain on the side of the back surface 11b relative to these etching grooves 19. By causing part of the substrate 11 to remain along the etching grooves 19 as above, the film 17 is allowed to be easily divided along the etching grooves 19 together with the remaining part of the substrate 11 in the later film dividing step. Obviously, the etching grooves 19 with such a depth as to reach the film 17 may be formed.

In this etching step, the substrate 11 can be processed along all planned dividing lines 13 at a time and the etching grooves 19 can be formed. Thus, in the case of separating the workpiece 1 in which the number of planned dividing lines 13 is large or the like, the time necessary for the processing per one planned dividing line 13 can be suppressed to a short time while the quality of the processing is kept.

Figure 4A:
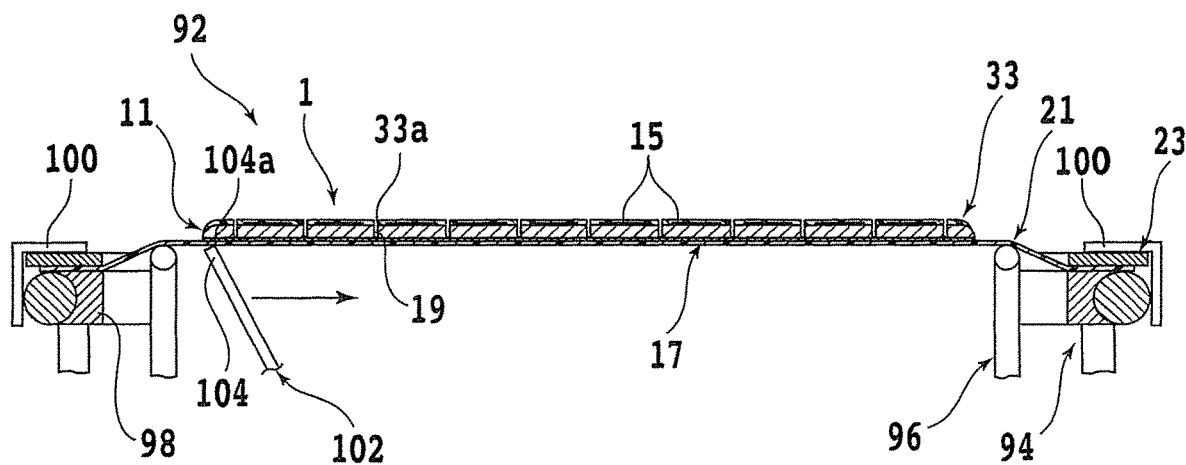
FIG. 4A is a partial sectional side view depicting a film dividing step.

After the etching step, the film dividing step of dividing the remaining film 17 along the etching grooves 19 is carried out. FIG. 4A is a partial sectional side view depicting the film dividing step. This film dividing step is carried out by using a dividing apparatus 92 depicted in FIG. 4A, for example. The dividing apparatus 92 includes a support structure 94 that supports the peripheral part of the sheet 21 in addition to the frame 23 and an expanding drum 96 with a circular cylindrical shape.

The support structure 94 includes a support table 98 having an opening with a circular shape in plan view. The peripheral part of the sheet 21 and the frame 23 are placed on the upper surface of the support table 98. Plural clamps 100 for fixing the frame 23 to the support table 98 are disposed around the support table 98.

The support table 98 is supported by a raising-lowering mechanism (not depicted) for raising and lowering the support structure 94. Furthermore, the expanding drum 96 is disposed inside the opening of the support table 98. The inner diameter of the expanding drum 96 is larger than the diameter of the workpiece 1. Meanwhile, the outer diameter of the expanding drum 96 is smaller than the inner diameter of the frame 23.

Figure 4B:
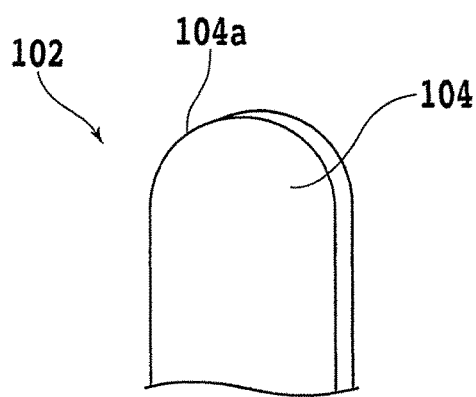
FIG. 4B is a perspective view schematically depicting an example of a pressing member used in the film dividing step.

A pressing member 102 for pressing the workpiece 1 and so forth upward is disposed in the region inside the expanding drum 96. FIG. 4B is a perspective view schematically depicting an example of the pressing member 102. The pressing member 102 is formed into a bar shape or plate shape by using a material such as a metal, resin, or ceramic, for example.

A tip part (upper end part) 104 of the pressing member 102 is formed into a semicircular disc shape, for example, and the shape of an edge 104a thereof is a curved shape. Meanwhile, the base end side (lower end side) of the pressing member 102 is supported by a movement mechanism (not depicted) and the pressing member 102 moves in a direction substantially parallel to the upper surface of the support table 98 by this movement mechanism.

However, there is no particular limit to the specific configuration of the pressing member 102. For example, the movement mechanism does not have to be disposed on the base end side of the pressing member 102. In this case, it is also possible to move the pressing member 102 by manual work by an operator, for example. Furthermore, it suffices that at least the shape of the edge 104a be a curved shape in the tip part 104 of the pressing member 102.

In the film dividing step, first, the peripheral part of the sheet 21 and the frame 23 are placed on the upper surface of the support table 98 and are fixed by the clamps 100 in such a manner that the mask pattern (protective film 33) formed on the substrate 11 is exposed upward. Before the peripheral part of the sheet 21 and the frame 23 are placed on the upper surface of the support table 98, the upper surface of the support table 98 is moved to a position at the same height as the upper end of the expanding drum 96 or a position higher than the upper end of the expanding drum 96 by the raising-lowering mechanism.

Next, as depicted in FIG. 4A, the support structure 94 is lowered by the raising-lowering mechanism and the upper surface of the support table 98 is moved to the lower side relative to the upper end of the expanding drum 96. As a result, the expanding drum 96 rises relative to the support table 98 and the sheet 21 is pushed upward by the expanding drum 96 to be expanded in a radial manner.

After the sheet 21 is expanded, the edge 104a of the tip part 104 of the pressing member 102 is moved upward and the workpiece 1 is pressed by the edge 104a with the intermediary of the sheet 21. Then, in the state in which the height of the tip part 104 is kept, the pressing member 102 is moved in a direction substantially parallel to the upper surface of the support table 98 as depicted in FIG. 4A. That is, while the workpiece 1 is pressed by the edge 104a of the tip part 104, the pressing member 102 is moved.

Figure 5A:
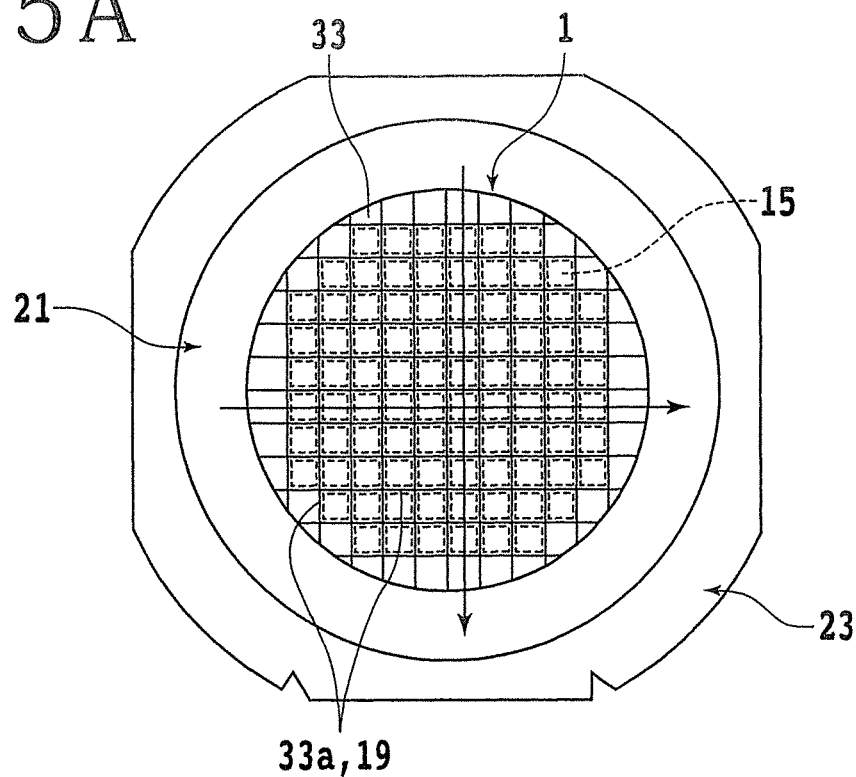
FIG. 5A is a plan view depicting the movement direction of the pressing member according to a first form.

FIG. 5A is a plan view depicting the movement direction of the pressing member 102 according to a first form and particularly depicts an example of the movement path along which the part in contact with the sheet 21 in the edge 104a moves. In this first form, the pressing member 102 is moved in a direction along any of the plural planned dividing lines 13 (etching grooves 19, exposed parts 33a) as depicted in FIG. 5A. In this case, it is preferable to adjust the position of the pressing member 102 in such a manner that the vicinity of the center of each region (region that becomes a device chip) of the workpiece 1 marked out by the planned dividing lines 13 is pressed upward by the tip part 104.

Figure 5B:
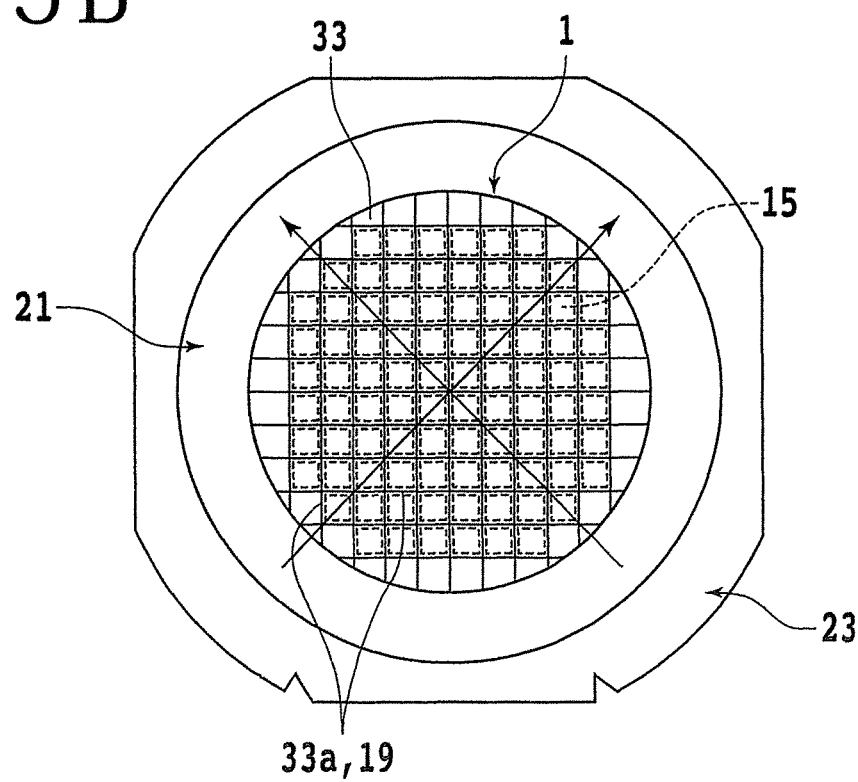
FIG. 5B is a plan view depicting the movement direction of the pressing member according to a second form.

FIG. 5B is a plan view depicting the movement direction of the pressing member 102 according to a second form and particularly depicts an example of the movement path along which the part in contact with the sheet 21 in the edge 104a moves. In this second form, the pressing member 102 is moved in a direction intersecting each of the plural planned dividing lines 13 (etching grooves 19, exposed parts 33a) intersecting each other as depicted in FIG. 5B. That is, the pressing member 102 is moved along a direction equivalent to a diagonal of each region (region that becomes a device chip) of the workpiece 1 marked out by the planned dividing lines 13.

When the pressing member 102 is moved in accordance with the above-described first form or second form, only the region pressed by the pressing member 102 in the plural regions of the workpiece 1 marked out by the planned dividing lines 13 moves to the upper side relative to the other regions. That is, the force is applied to the planned dividing lines 13 (etching grooves 19) that define the region of the target and the film 17 is divided along these etching grooves 19.

In the present embodiment, the orientation of the pressing member 102 is adjusted in such a manner that the orientation of the part in contact with the sheet 21 in the edge 104a becomes substantially perpendicular to the movement direction of the pressing member 102. However, there is no particular limit to the orientation of the pressing member 102. For example, the orientation of the pressing member 102 may be adjusted in such a manner that the orientation of the part in contact with the sheet 21 in the edge 104a becomes substantially parallel to the movement direction of the pressing member 102.

The above-described procedure is repeated. When the film 17 has been divided along all planned dividing lines 13 and the workpiece 1 has been separated into plural chips, the film dividing step ends. The form of the movement of the pressing member 102 is not limited to the above-described first form and second form. For example, the pressing member 102 may be moved to draw an arbitrary curve.

Figure 6:
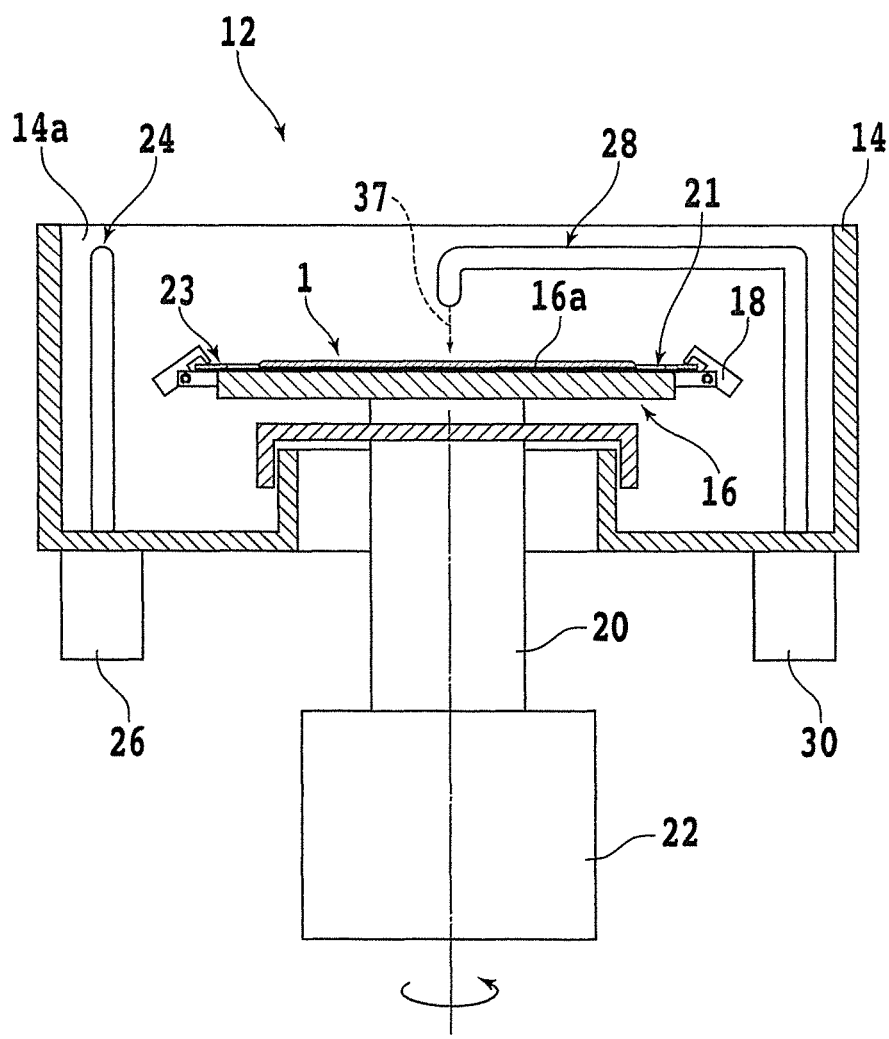
FIG. 6 is a partial sectional side view depicting a mask pattern removing step.

After the film dividing step, the mask pattern removing step of removing the mask pattern (protective film 33) remaining on the substrate 11 is carried out. FIG. 6 is a partial sectional side view depicting the mask pattern removing step. The mask pattern removing step in the present embodiment is carried out by using the spin coater 12 used in the protective film forming step.

In the mask pattern removing step, first, the workpiece 1 and so forth are placed on the spinner table 16 in such a manner that the sheet 21 stuck to the workpiece 1 is brought into contact with the holding surface 16a of the spinner table 16. Next, a negative pressure of the suction source is caused to act on the holding surface 16a. Thereby, the side of the film 17 of the workpiece 1 (side of the back surface 11b of the substrate 11) is sucked and held by the spinner table 16 with the intermediary of the sheet 21. That is, the state in which the mask pattern (protective film 33) remaining on the substrate 11 is exposed upward is obtained.

Thereafter, the tip part of the second nozzle 28 is moved to the cleaning region directly above the spinner table 16 and a fluid 37 for cleaning is sprayed from this tip part toward the workpiece 1 (front surface 11a of the substrate 11) held by the spinner table 16. In conjunction with this, the spinner table 16 is rotated.

As a result, the mask pattern (protective film 33) is removed from the substrate 11 due to the pressure of the fluid 37 for cleaning sprayed from the second nozzle 28. As the fluid 37 for cleaning, besides a liquid such as water, a mixed fluid (binary fluid) obtained by mixing a liquid such as water and a gas such as air can be used. When the mask pattern (protective film 33) covering the side of the front surface 11a of the substrate 11 has been removed, the mask pattern removing step ends.

As described above, in the processing method of a workpiece according to the present embodiment, dry etching (plasma etching) is carried out from the side of the front surface 11a of the substrate 11 on which the film 17 is made on the back surface 11b and the etching grooves 19 along the planned dividing lines (streets) 13 are formed. Thereafter, the workpiece 1 is pressed by the edge 104a of the tip part 104 of the pressing member 102 having the tip part 104 in which the edge 104a has a curved shape and the remaining film 17 and so forth are divided along the etching grooves 19. Therefore, the workpiece 1 including the film 17 can be surely divided differently from the existing processing method using only dry etching.

Furthermore, in the processing method of a workpiece according to the present embodiment, it suffices to only press the workpiece 1 by the edge 104a of the tip part 104 of the pressing member 102 when the film 17 and so forth remaining in the workpiece 1 are divided along the etching grooves 19. Therefore, the workpiece 1 can be easily divided compared with the case of using a cutting apparatus or a laser processing apparatus for the dividing of the film 17 and so forth, or the like. As above, according to the present embodiment, a new processing method of a workpiece by which the workpiece 1 can be divided easily and surely is provided.

The present invention is not limited to the description of the above embodiment and can be carried out with various changes. For example, in the above embodiment, the sheet sticking step and the sheet adhesion step are carried out before the protective film forming step. However, it suffices for these steps to be carried out before the film dividing step is carried out, for example.

Furthermore, in the sheet adhesion step in the above embodiment, the sheet 21 is heated to cause the sheet 21 to adhere to the workpiece 1. However, it is also possible to cause the sheet 21 to adhere to the workpiece 1 by heating the substrate 11 (workpiece 1). The sheet adhesion step may be omitted if the sheet 21 can be caused to adhere to the workpiece 1 in the sheet sticking step.

Moreover, after the protective film forming step, a drying step of drying the liquid resin 31, a heating step of heating the liquid resin 31 or the like may be carried out according to need before the mask pattern forming step. This makes it easy to form the protective film 33 suitable for formation of the mask pattern in some cases.

Furthermore, in the film dividing step in the above embodiment, the workpiece 1 is pressed by the pressing member 102 with the intermediary of the sheet 21 after the sheet 21 is expanded. However, the sheet 21 does not necessarily have to be expanded when the workpiece 1 is pressed by the pressing member 102. However, in the case of expanding the sheet 21, it becomes hard for the force by the pressing member 102 to escape to the sheet 21 and the force properly acts on the workpiece 1. Thus, the film 17 can be divided more surely.

Moreover, in the above embodiment, the mask pattern removing step is carried out after the film dividing step. However, it suffices for the mask pattern removing step to be carried out at an arbitrary timing after the etching step. For example, it is also possible to omit the mask pattern removing step of the present embodiment if there is an opportunity to remove the mask pattern in a later cleaning step or the like.

Besides, structures, methods, and so forth according to the above embodiment can be carried out with appropriate changes without departing from the range of the object of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A processing method of a workpiece for processing the workpiece including a substrate having a plurality of regions marked out by a plurality of planned dividing lines intersecting each other on a front surface side and a film made on a back surface of the substrate, the processing method comprising:
    a sheet sticking step of sticking a sheet to the film made on the back surface of the substrate and sticking a peripheral part of the sheet to a ring-shaped frame;
    a protective film forming step of forming a protective film that covers the front surface side of the substrate;
    a mask pattern forming step of removing a part corresponding to the plurality of planned dividing lines in the protective film and forming a mask pattern formed of the protective film on the front surface side of the substrate after carrying out the protective film forming step;
    an etching step of carrying out dry etching for the substrate from the front surface side on which the mask pattern is formed and forming etching grooves along the plurality of planned dividing lines after carrying out the mask pattern forming step; and
    a film dividing step of dividing the film along the etching grooves by pressing the workpiece through the sheet by an outer edge of a tip part of an elongated pressing member in a state in which the sheet is expanded after carrying out the etching step, the tip part being flat with opposing surfaces and the outer edge being in a curved shape.

2. The processing method of a workpiece according to claim 1, further comprising:
    an adhesion step of heating the sheet or the workpiece to cause the sheet to adhere to the workpiece after carrying out the sheet sticking step.

3. The processing method of a workpiece according to claim 1, wherein
    the pressing member is moved in a direction along any of the plurality of planned dividing lines in the film dividing step.

4. The processing method of a workpiece according to claim 1, wherein
    the pressing member is moved in a direction diagonal to the plurality of planned dividing lines in the film dividing step.

5. The processing method of a workpiece according to claim 1, wherein
    the etching grooves with such a depth as not to reach the film are formed to cause part of the substrate to remain on a side of the back surface relative to the etching grooves in the etching step.

6. The processing method of a workpiece according to claim 1, wherein outer edge of the tip part is formed in a semicircular disk shape.

7. The processing method of a workpiece according to claim 1, wherein the pressing member is moved repeatedly across the workpiece while pressing the workpiece to divide the film along each of the etching grooves.

* * * * *